United States Patent
Vidhi et al.

(10) Patent No.: US 10,107,864 B2
(45) Date of Patent: Oct. 23, 2018

(54) STEP-TIME BATTERY DEGRADATION DETERMINATION

(71) Applicant: Inventus Holdings, LLC, Juno Beach, FL (US)

(72) Inventors: Rachana Vidhi, Palm Beach Gardens, FL (US); Carlos Alves, Royal Palm Beach, FL (US)

(73) Assignee: Inventus Holdings, LLC, Juno Beach, FL (US)

( * ) Notice: Subject to any disclaimer, the term of this patent is extended or adjusted under 35 U.S.C. 154(b) by 290 days.

(21) Appl. No.: 15/095,693

(22) Filed: Apr. 11, 2016

(65) Prior Publication Data

US 2017/0292998 A1   Oct. 12, 2017

(51) Int. Cl.
*G01R 31/36* (2006.01)

(52) U.S. Cl.
CPC ..... *G01R 31/3648* (2013.01); *G01R 31/3634* (2013.01)

(58) Field of Classification Search
CPC .......................... G01R 31/3651; G01R 31/3658
See application file for complete search history.

(56) References Cited

U.S. PATENT DOCUMENTS

| 2002/0161537 A1 | 10/2002 | Odaohhara |
| 2005/0127877 A1 | 6/2005 | Tsuchiya et al. |
| 2007/0114971 A1 | 5/2007 | Uesaka et al. |
| 2010/0090650 A1 | 4/2010 | Yazami et al. |
| 2012/0116701 A1 | 5/2012 | Yuasa |
| 2013/0030739 A1 | 1/2013 | Takahashi et al. |
| 2013/0271148 A1 | 10/2013 | Maeda |
| 2013/0311119 A1 | 11/2013 | Tamezane |

(Continued)

FOREIGN PATENT DOCUMENTS

CN   103778280   5/2014

OTHER PUBLICATIONS

Liu, D., et al., "Lithium-ion Battery Remaining Useful Life Estimation Based on Nonlinear AR Model Combined with Degradation Feature", Proceedings of the Annual Conference of Prognostics and Health Management Society, Sep. 23-27, 2012, pp. 1-7.

(Continued)

*Primary Examiner* — Thomas L Dickey
(74) *Attorney, Agent, or Firm* — Donna Flores; Fleit Gibbons Gutman Bongini & Bianco P.L.

(57) ABSTRACT

Various embodiments determine a remaining battery capacity of a battery in an energy storage battery support system. In one embodiment, a battery is operated at a state of charge which may include being charged, being discharged, and being idle. A change in the state of charge is detected after a duration of time. The amount of remaining battery capacity is calculated based upon the duration of time and the state of charge of the battery during the duration of time. The operating, detecting and calculating are repeated until the amount of remaining battery capacity reaches a predetermined value. The remaining battery capacity after the duration of time is calculated using the battery capacity at the beginning of the duration of time. The battery may be used as an energy source in an electric power distribution grid. The battery is replaced when the remaining battery capacity reaches an end-of-useful-life value.

20 Claims, 5 Drawing Sheets

(56) References Cited

U.S. PATENT DOCUMENTS

2014/0333265 A1* 11/2014 Kinjo .................. G01R 31/3624
320/134
2016/0239592 A1* 8/2016 Pourmousavi Kani ......................
G06F 17/5009
2016/0370433 A1* 12/2016 Chazal ............... G01R 31/3658
2017/0115358 A1* 4/2017 Kani .................. G01R 31/3679

OTHER PUBLICATIONS

Groot, J., "State-of-Health Estimation of Li-ion Batteries: Cycle Life Test Methods" Thesis for the Degree of Licentiate of Engineering, Division of Electric Power Engineering, Department of Energy and Environment, Chalmers University of Technology, 2012, pp. 1-148.

* cited by examiner

STEP-TIME BATTERY DEGRADATION DETERMINATION

BACKGROUND

Field of the Invention

The present disclosure generally relates to rechargeable batteries, and more particularly relates to determining a remaining battery capacity or battery degradation of a rechargeable battery.

Description of the Related Art

The determination of the degradation of a battery (or state of health) is important in the management of a battery system, such as a battery system used as an energy source in an electric power distribution grid. Battery degradation is a factor in determining the available capacity of the battery system. The available capacity of the battery system may be used to adjust the operation of other power generators (such as solar, wind, gas, oil, coal and nuclear generators) as well as manage loads associated with the grid. The degradation of the battery may also be a factor in the replacement of the battery and the determination and control of the degradation may be a factor in the efficiency of inventory management of replacement batteries.

A first existing approach, generally referred to as calendar degradation, is to calculate battery degradation based on the constant charge level over time. A second existing approach, generally referred to as cycling degradation, is to calculate battery degradation based upon rates and levels of charge and discharge. These existing battery degradation calculations rely on combining the total time spent at a particular power rate (C-rate) and total idle times.

BRIEF SUMMARY

In one embodiment, a method for determining the remaining battery capacity of a battery is disclosed. The method comprises operating a battery at a state of charge, detecting a change in the state of charge after a duration of time, calculating the amount of remaining battery capacity based upon the duration of time and the state of charge of the battery during the duration of time, and repeating the operating, detecting and calculating until the amount of remaining battery capacity reaches a predetermined value.

In another embodiment, an energy storage battery support system is disclosed. The energy storage battery support system comprises a rechargeable battery, a load, an inverter that exchanges energy between the rechargeable battery and the load, a state of charge monitor and a controller. The state of charge monitor monitors the operation of the battery at a state of charge, detects a change in the state of charge after a duration of time, and calculates an amount of remaining battery capacity based upon the duration of time and the state of charge of the battery during the duration of time, The controller incorporates the remaining battery capacity in determining whether to charge or discharge the battery through the inverter and how much electrical current to provide to or take from the battery.

In yet another embodiment, a computer program product for determining a remaining battery capacity of a battery is disclosed. The computer program product comprises a non-transitory storage medium readable by a processing circuit and storing instructions for execution by the processing circuit for performing a method. The method comprises operating a battery at a state of charge, detecting a change in the state of charge after a duration of time, calculating an amount of remaining battery capacity based upon the duration of time and the state of charge of the battery during the duration of time, and repeating the operating, detecting and calculating until the amount of remaining battery capacity reaches a predetermined value.

BRIEF DESCRIPTION OF THE SEVERAL VIEWS OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present disclosure, in which.

DETAILED DESCRIPTION

In this disclosure, a method is presented for determining an amount of degradation of capacity (state of health) of an operating battery having a specified degradation of capacity.

Figure 1:
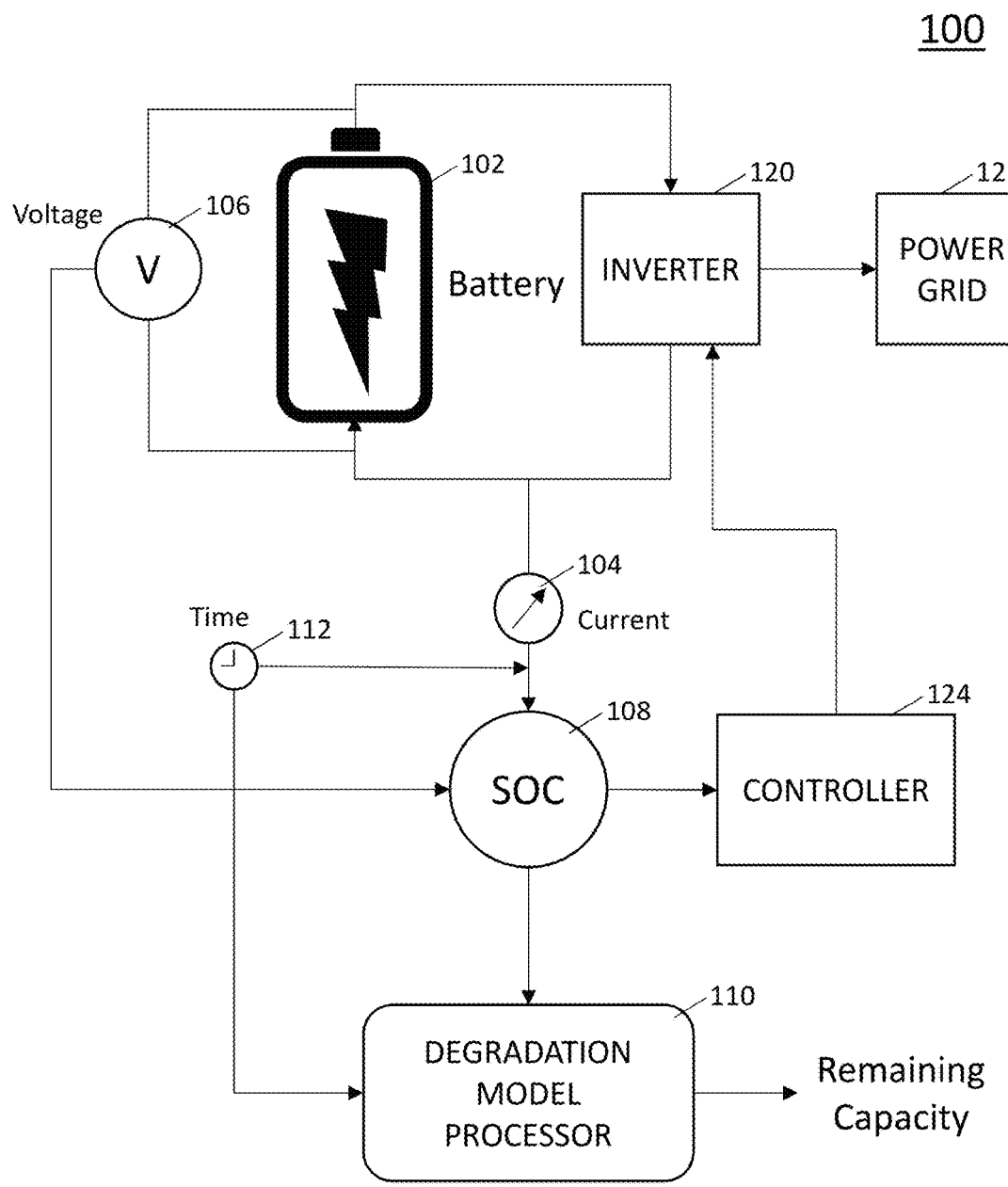
FIG. 1 is a block diagram illustrating one example of an operating environment comprising a battery based energy storage system according to one embodiment of the present disclosure.

FIG. 1 depicts an energy storage battery support system 100 according to one example. The energy storage battery support system 100 depicts components of an example of a battery based energy storage system that allows the battery 102 to be incorporated into an electrical power system such as an electrical power grid 122. The battery 102 in this example is connected to an inverter 120 that exchanges energy between the battery 102 and a power grid 122 in this example. The battery 102 in this example is able to periodically provide electric power through the inverter 120 to the grid 122, or to a particular load or premises on the grid 122 in further examples, based upon a number of factors including demand and load management factors. A controller 124 generally controls the direction and amount of energy being exchanged through the inverter 120 and is therefore able to control the charging and discharging cycles of the battery 102. It should be noted that the battery 102 may be used to provide power to other loads in addition to or in place of the electrical power grid 122.

The energy storage battery support system 100 includes a battery 102 and a state of charge (SOC) monitor 108 that operates to monitor the operation of the battery 102 and determine an estimate of the amount of charge in the battery, which corresponds to the energy remaining in the battery, at a given time. The state of charge monitor 108 provides the present state of charge of the battery 102 to the controller 124. The controller 124 is able to incorporate the present state of charge of the battery in determining whether to charge or discharge the battery 102 through inverter 120, and how much electrical current should be provided to or taken from the battery 102.

The battery 102 in this example is connected in a parallel configuration with a voltmeter 106. Voltmeter 106 measures and reports output voltages of the battery 102. The voltmeter 106 is able to measure the instantaneous voltage across the battery 102. The voltmeter 106, in this example, reports the instantaneous output voltage of the battery to the state of charge monitor 108. The battery 102 and voltmeter 106, in some examples, are able to be connected in a substantially parallel configuration and with either direct or indirect couplings. Indirect connections are able to include, as an example, resistive components, reactive components, active components, or combinations of these.

The battery 102 is further connected in series with an ammeter 104. The ammeter 104, in an example, continuously monitors the electrical current passing through the battery 102 and reports these readings to the state of charge monitor 108. The battery 102 and ammeter 104 in one example may be in a substantially series configuration such that all or nearly all of the current that passes through one component passing through the other.

The state of charge monitor 108, in one example, is a dedicated processor or a computing process within a general purpose processor that receives, assembles and processes battery status data to determine or estimate the present state of charge of the battery 102. In an example, the state of charge monitor 108 estimates the state of charge present in the battery is determined based on the battery output voltage measurements received from the voltmeter 106 and the electrical current measurements received from ammeter 104. In an example, electrical current drawn from or provided to the battery 102 is integrated and this integrated value is used as a basis for determining the state of charge of the battery 102.

In an example, the state of charge monitor 108 is also able to determine the charging state of the battery 102. The charging state of the battery 102, in an example, is able to be one of that the battery 102 is in a state of being charged, being discharged, or the battery 102 is idle without appreciable current flowing therethrough. In an example, the charging state of the battery 102 is able to be determined by the present direction of current flow through the battery 102, where current into the battery 102 indicates that the battery 102 is being charged, current being drawn from the battery 102 indicates that the battery 102 is being discharged, and substantially no current through the battery 102 indicated that the battery 102 is idle.

The maximum amount of energy that a battery 102 is able to store when the battery is fully charged is referred to as the battery's present capacity. The total amount of battery capacity of the batteries 102 in the battery system 100 degrades with usage and time. The capacity fade of a battery refers to the amount of degradation in the amount of total energy that a battery 102 is able to store, i.e., a reduction in the battery capacity. The percentage of degradation is related to a battery's "state of health" by this correlation: "State of Health=100−Percent Degradation". A degradation model processor 110 determines the present state of health of the battery 102. The degradation processor 110 receives from the state of charge monitor 108, in an example, both an indication of the charging state of the battery 102 and the estimated present state of charge of the battery 102. The degradation model processor 110 monitors the operation of the battery 102 as measured by the voltmeter 106 and ammeter 104 over time and applies a degradation model using these measurements to determine the present remaining capacity of the battery 102.

The state of charge monitor 108 and degradation model processor 110 both monitor, accumulate and process measured values and determined values and conditions over various time durations. The state of charge monitor 108 integrates the amount of electrical current provided to or drawn from the battery 102 over time. As described in further detail below, the degradation model 110 determines the remaining capacity of the battery 102 based on observed charging states and electrical current flowing through the battery 102 over time. The energy storage battery support system 100 includes a time source 112 to provide this time to these components to support their operation.

Existing battery degradation calculations rely on combining the total time spent at a particular charge rate (C-rate) and total idle times. The sequential effect of each process in a cycle is neglected in this process. It is important to know the initial capacity of the battery before calculating the degradation.

Degradation Mechanism for Li-Ion Batteries

There are two main modes of efficiency degradation in Lithium ion batteries: calendar degradation and cycling degradation. Calendar degradation is due to Lithium oxidation on the negative electrode and happens when the batteries are in an idle state. Battery degradation is lower when it idles at a lower state of charge. While the most accurate equation describing physical phenomenon is difficult to predict, an exponential correlation, shown in equation [1], works with reasonable accuracy:

$$Q_{cal}=Q_{bol}-b_1 t^\alpha \quad [1]$$

Here, $Q_{cal}$ is the remaining energy capacity after the calendar degradation, $Q_{bol}$ is the energy capacity at the beginning of life, and $b_1$ and $\alpha$ are the calendar coefficients. $b_1$ varies for every state of charge, while $\alpha$ remains constant.

As the name suggests, cycling degradation is caused by charge-discharge cycles of the battery that lead to loss of cyclable Lithium. Cycles with higher depths of discharge cause higher degradation compared to cycles with lower depths of discharge. The degradation profile depends on the power rate (C-rate) at which the battery charges or discharges. Higher C-rates generally result in higher degradation, but it is possible to design a battery to find an optimum C-rate value.

In equation [2], $Q_{cyc}$ is the remaining capacity after N cycles, $Q_{bol}$ is the capacity at beginning of life and f(N) is a cycling function dependent on the C-rate and the number of cycles:

$$Q_{cyc}=Q_{bol}-f(N) \quad [2]$$

Time-Step Calculation of Battery Degradation

Figure 2:
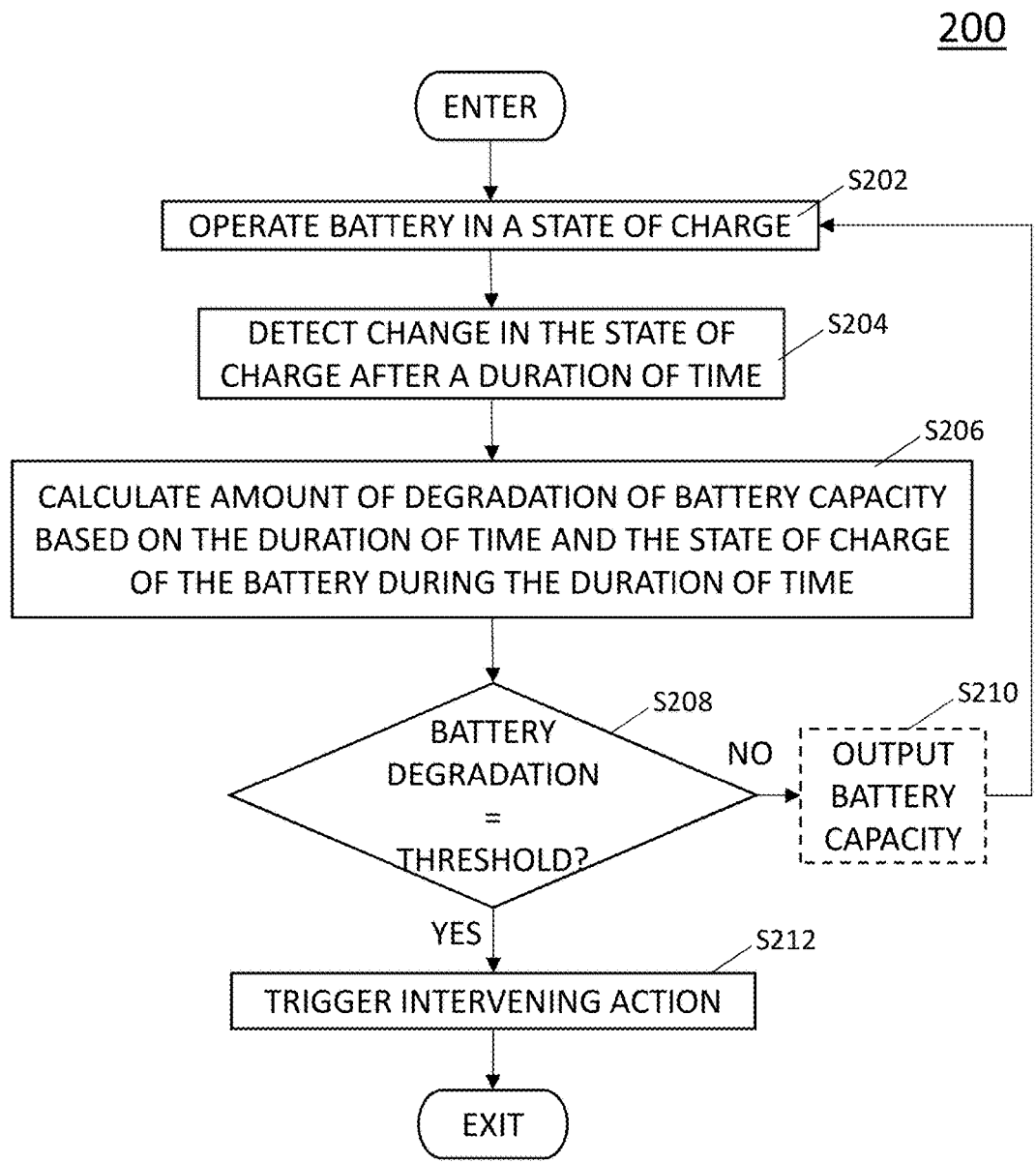
FIG. 2 is an operational flow diagram illustrating one process of determining remaining battery capacity for use in operating a battery in accordance with one example of the present disclosure.

FIG. 2 presents an operational flowchart 200 of an example method of determining the degradation of a battery 102 on a step time basis which calculates capacity and/or degradation of capacity every time a change in state is encountered. The degradation at each time-step is calculated by using the capacity at the beginning of that interval. The resulting capacity then becomes an initial point for calculating degradation at the next interval and so on. This process can be used for calculating the capacity at any given time.

Beginning in step S202, the battery 102 is operated in a first state of charge (SOC). The state of charge may be one of being charged, being discharged or being idle without appreciable current flowing the battery 102. A change in the SOC is detected, at step S204, after a duration of time. The change in SOC may include going from an idle state to a charging state, from a charging state to a discharging state, from a discharging state to an idle state, and so forth. The amount of degradation of battery capacity is calculated, at step S206, based on the duration of time and the SOC of the battery during that time interval. For example, calendar degradation is the primary degradation occurring when the battery 102 is in an idle state, while cyclable degradation is the primary means of degradation during charging or discharging cycles.

For calendar degradation caused when the battery 102 stays idle for a time interval Δt, the remaining capacity at the end of the interval can be calculated using equation [3]:

$$Q_f = 1 - b_1 \left( \left( \frac{1-Q_i}{b_1} \right)^{\frac{1}{\alpha}} + \Delta t \right)^\alpha \quad [3]$$

Here, $Q_f$ is the final energy capacity, $Q_i$ is the initial energy capacity, Δt is the time interval, and $b_1$ and a are the calendar coefficients.

For cyclable degradation occurring during charging or discharging, if the battery 102 undergoes n cycles (full or partial) at a given C-rate, the resulting remaining capacity can be calculated by equation [4]:

$$Q_f = Q_i - \int_i^f \left( \frac{d(f(N_C))}{dn} \right) dn \quad [4]$$

Here, $Q_f$ is the final energy capacity, $Q_i$ is the initial energy capacity, $f(N_C)$ is the cycling function at the cycle rate of C, n is the number of cycles, and i and f represent the initial and final stages.

As long as the battery capacity is not equal to a predetermined threshold, such as an end-of-useful-life value, at step S208, the process is repeated at every change in the SOC. The remaining battery capacity and/or degradation in capacity may be optionally output, at step S210, for use by an outside party, such as another process, monitor or application. When the battery capacity equals the predetermined threshold, at step S208, intervening action may be triggered, at step S212. For example, an audible or visual alert may be triggered or a message may be sent to a maintenance entity advising appropriate personnel of the current battery capacity. When the predetermined threshold is the end-of-useful-life value, the battery 102 may be replaced.

Figure 3:
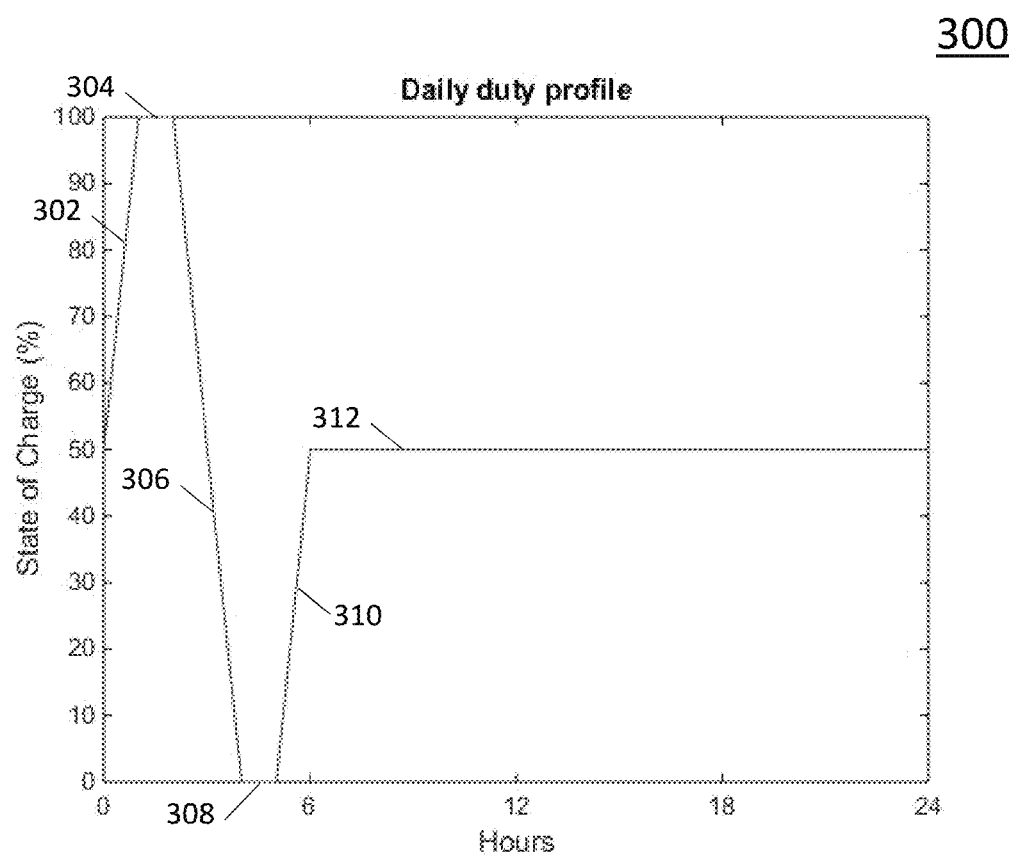
FIG. 3 is a graphical representation of a daily duty profile of a rechargeable battery according to one embodiment of the present disclosure.

In the graph 300 of FIG. 3, an example daily duty profile of a battery 102 is shown. The degradation is calculated for the time period 302 when the SOC increases from 50% to 100%. The degradation is also calculated when the battery rests at 100% SOC during time period 304, when the battery goes from 100% to 0% SOC during time period 306, during the rest period 308 at 0% SOC, during the time period 310 when the battery 102 is charging back to 50% SOC and for the idle time 312 at 50% SOC. The method can calculate different degradation values depending on different rest periods, as calculations are performed at each time interval. While the previous methods only account for one complete cycle and idle time. The improvement can improve the accuracy of predicted degradation and the associated operation and maintenance costs.

Figure 4:
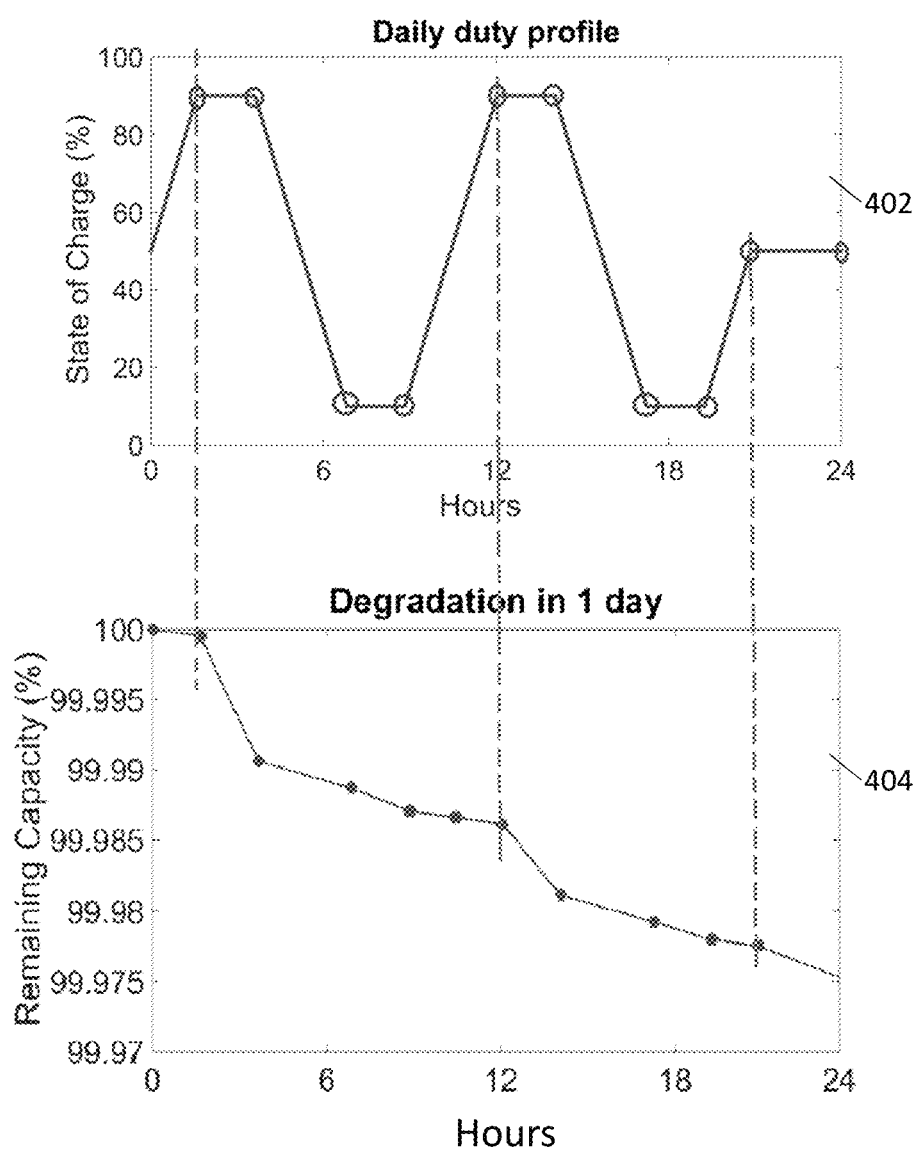
FIG. 4 is a graphical representation of a daily duty profile of a rechargeable battery and a corresponding battery degradation in a one day period according to one embodiment of the present disclosure.

In FIG. 4, a second graph 400 showing a different example daily duty profile 402 for a battery 102 is provided, along with a corresponding graph 404 of the remaining battery capacity calculated over a one-day period. The battery capacity is recalculated every time a change in state from cycling to calendar is encountered (as indicated by circles). The capacity values corresponding to the duty cycle are shown below the daily duty profile.

Figure 5:
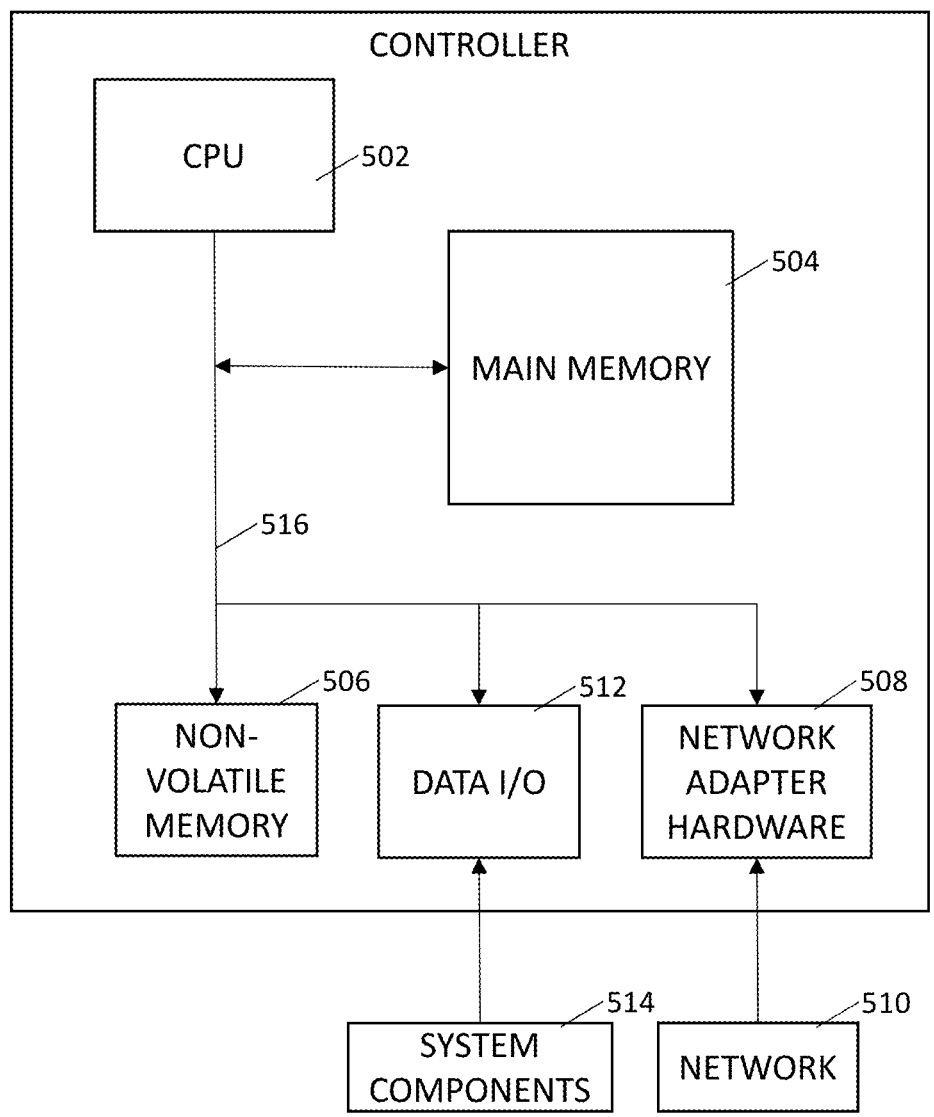
FIG. 5 is a block diagram of an example controller for use with the battery based energy storage system of FIG. 1, according to one embodiment of the present disclosure.

Turning now to FIG. 5, a block diagram illustrating a controller, such as controller 124 from FIG. 1, is provided in accordance with one example of the present disclosure. The controller 124 is an example of a processing subsystem that is able to perform any of the above described processing operations, control operations, other operations, or combinations of these.

The controller 124 in this example includes a central processing unit (CPU) 502 that is communicatively connected to a main memory 504 (e.g., volatile memory) and a non-volatile memory 506 to support processing operations. The CPU 502 is further communicatively coupled to a network adapter hardware 508 to support input and output communications with external computing systems such as through the illustrated network 510.

The controller 124 further includes a data input/output (I/O) processor 512 that is able to be adapted to communicate with any type of equipment, such as the illustrated system components 514. The data input/output (I/O) processor 512, in various examples, is able to be configured to support any type of data communications connections including present day analog and/or digital techniques or via a future communications mechanism. A system bus 516 interconnects these system components.

Non-Limiting Embodiments

As will be appreciated by one skilled in the art, aspects of the present disclosure may be embodied as a system, method, or computer program product. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit", "module", or "system."

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers, and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer maybe connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method of determining a remaining battery capacity of a battery comprising;
    operating a battery as an energy source in an electric power distribution grid through a series of states of charge including idle, charging and discharging states;

switching from a first state of charge from one of an idle, charging or discharging state to a different one of the idle, charging or discharging states, after a duration of time;

responsive to the switching, calculating an amount of remaining battery capacity based upon a complete history of accrued battery degradation for the battery including battery degradation accrued during the first state of charge and a type of the first state of charge of the battery;

repeating the operating, switching and calculating for each state in the series of states of charge until the calculated remaining battery capacity is determined to have reached an end-of-life threshold; and responsive to determining that the calculated remaining battery capacity has reached an end-of-life threshold, replacing the battery with a new battery.

2. The method of claim 1, wherein the amount of remaining battery capacity for each state in the series of states of charge is calculated using the remaining battery capacity of the battery calculated for an immediately preceeding state as an initial battery capacity of the first state.

3. The method of claim 1, wherein the type of the first state of charge determines a formula to use for the calculating.

4. The method of claim 3, wherein the type of state of charge is idle, the formula for calculating the remaining battery capacity is $$Q_f = 1 - b_1\left(\left(\frac{1-Q_i}{b_1}\right)^{\frac{1}{\alpha}} + \Delta t\right)^\alpha$$

where $Q_f$ is a final battery capacity, $Q_i$ is an initial battery capacity, $\Delta t$ is the duration of time, and $b_1$ and $\alpha$ are calendar coefficients.

5. The method of claim 3, wherein the type of state of charge is one of charging or discharging, the formula for calculating the remaining battery capacity is $$Q_f = Q_i - \int_i^f \left(\frac{d(f(N_C))}{dn}\right)dn$$

where $Q_f$ is a final battery capacity, $Q_i$ is an initial battery capacity, $f(N_C)$ is a cycling function at a cycle rate of C, n is a number of cycles, and i and f represent initial and final stages.

6. The method of claim 3, wherein $b_1$ varies for every state of charge and $\alpha$ remains constant.

7. The method of claim 1, wherein the different state of charge is discharging, the method further comprises: responsive to determining that the calculated remaining battery capacity has not reached an end-of-life threshold, outputting energy from the remaining battery capacity to a load.

8. The method of claim 7, wherein the load is the electric power distribution grid.

9. The method of claim 7, wherein the energy is output for use by an outside party.

10. The energy storage battery support system of claim 9, wherein the load is the electric power distribution grid.

11. An energy storage battery support system for use in an electric power distribution grid, the energy storage battery support system comprising:

a rechargeable battery;

a load;

an inverter that exchanges energy between the rechargeable battery and the load; and a controller that:
operates the battery through a series of states of charge including idle, charging and discharging states; and
switches operation from a first state of charge from one of an idle, charging or discharging state to a different one of the idle, charging or discharging states, after a duration of time a state of charge monitor that:
monitors the operation of the battery;
detects the switch in the state of charge after a duration of time; and
responsive to the switching, calculates an amount of remaining battery capacity based upon a complete history of accrued battery degradation for the battery including battery degradation accrued during the first state of charge and a type of the first state of charge of the battery; and wherein the controller further controls:
repeating the operating, switching and calculating for each state in the series of states of charge until the calculated remaining battery capacity is determined to have reached an end-of-life threshold; and
responsive to determining that the calculated remaining battery capacity has reached an end-of-life threshold, replacing the battery with a new battery.

12. The energy storage battery support system of claim 11, wherein the state of charge monitor calculates the amount of remaining battery capacity for each state in the series of states of charge using the remaining battery capacity of the battery calculated for an immediately preceeding state as an initial battery capacity of the first state.

13. The energy storage battery support system of claim 11, wherein the type of the first state of charge determines a formula to use for the calculating.

14. The energy storage battery support system of claim 13, wherein the type of state of charge is idle, the formula for calculating the remaining battery capacity is $$Q_f = 1 - b_1\left(\left(\frac{1-Q_i}{b_1}\right)^{\frac{1}{\alpha}} + \Delta t\right)^\alpha$$

where $Q_f$ is a final battery capacity, $Q_i$ is an initial battery capacity, $\Delta t$ is the duration of time, and $b_1$ and $\alpha$ are calendar coefficients.

15. The energy storage battery support system of claim 13, wherein the type of state of charge is one of charging or discharging, the formula for calculating the remaining battery capacity is $$Q_f = Q_i - \int_i^f \left(\frac{d(f(N_C))}{dn}\right)dn$$

where $Q_f$ is a final battery capacity, $Q_i$ is an initial battery capacity, $f(N_C)$ is a cycling function at a cycle rate of C, n is a number of cycles, and i and f represent initial and final stages.

16. A computer program product for determining a remaining battery capacity of a battery, the computer program product comprising:

a non-transitory storage medium readable by a processing circuit and storing instructions for execution by the processing circuit for performing a method comprising:

operating a battery as an energy source in an electric power distribution grid through a series of states of charge including idle, charging and discharging states;

switching from a first state of charge from one of an idle, charging or discharging state to a different one of the idle, charging or discharging states, after a duration of time;

responsive to the switching, calculating an amount of remaining battery capacity based upon a complete history of accrued battery degradation for the battery including battery degradation accrued during the first state of charge and a type of the first state of charge of the battery;

repeating the operating, switching and calculating for each state in the series of states of charge until the calculated remaining battery capacity is determined to have reached an end-of-life threshold; and responsive to determining that the calculated remaining battery capacity has reached an end-of-life threshold, replacing the battery with a new battery.

17. The computer program product of claim 16, wherein the amount of remaining battery capacity for each state in the series of states of charge is calculated using the remaining battery capacity of the battery calculated for an immediately preceeding state as an initial battery capacity of the first state.

18. The computer program product of claim 16, wherein the type of the first state of charge determines a formula to use for the calculating, the formula for calculating the remaining battery capacity is $$Q_f = 1 - b_1 \left[ \left( \frac{1-Q_i}{b_1} \right)^{\frac{1}{\alpha}} + \Delta t \right]^{\alpha}$$

where $Q_f$ is a final battery capacity, $Q_i$ is an initial battery capacity, $\Delta t$ is the duration of time, and $b_1$ and $\alpha$ are calendar coefficients when the type of the first state of charge is idle, and the formula for calculating the remaining battery capacity is $$Q_f = Q_i - \int_i^f \left( \frac{d(f(N_C))}{dn} \right) dn$$

where $Q_f$ is a final battery capacity, $Q_i$ is an initial battery capacity, $f(N_C)$ is a cycling function at a cycle rate of C, n is a number of cycles, and i and f represent initial and final stages.

19. The computer program product of claim 16, wherein the different state of charge is discharging, the method further comprises: responsive to determining that the calculated remaining battery capacity has not reached an end-of-life threshold, outputting energy from the remaining battery capacity to a load.

20. The computer program product of claim 19, wherein the energy is output for use by an outside party.

* * * * *